(12) United States Patent
Anand et al.

(10) Patent No.: US 7,609,577 B2
(45) Date of Patent: *Oct. 27, 2009

(54) DESIGN STRUCTURE FOR IMPROVING SENSING MARGIN OF ELECTRICALLY PROGRAMMABLE FUSES

(75) Inventors: Darren L. Anand, Essex Junction, VT (US); Gregory J. Fredeman, Wappingers Falls, NY (US); Toshiaki Kirihata, Poughkeepsie, NY (US); Alan J. Leslie, Wappingers Falls, NY (US); John M. Safran, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/872,273

(22) Filed: Oct. 15, 2007

(65) Prior Publication Data

US 2008/0030260 A1 Feb. 7, 2008

Related U.S. Application Data

(63) Continuation-in-part of application No. 11/460,464, filed on Jul. 27, 2006, now Pat. No. 7,307,911.

(51) Int. Cl.
*G11C 7/06* (2006.01)
(52) U.S. Cl. ............... 365/225.7; 365/148; 365/205
(58) Field of Classification Search .......... 365/96, 365/100
See application file for complete search history.

(56) References Cited

U.S. PATENT DOCUMENTS

| 6,230,292 | B1 | 5/2001 | Duesman et al. |
| 6,417,720 | B1 | 7/2002 | Denham |
| 6,498,526 | B2 | 12/2002 | Lim et al. |
| 6,590,804 | B1 | 7/2003 | Perner |
| 6,608,789 | B2 | 8/2003 | Sullivan et al. |
| 6,700,415 | B2 | 3/2004 | Telecco |
| 6,807,101 | B2 | 10/2004 | Ooishi et al. |
| 6,819,144 | B2 | 11/2004 | Li et al. |
| 6,919,754 | B2 | 7/2005 | Kuroki |
| 6,995,601 | B2 | 2/2006 | Huang et al. |
| 7,307,911 | B1 * | 12/2007 | Anand et al. ............ 365/225.7 |
| 7,369,452 | B2 * | 5/2008 | Kenkare et al. ......... 365/225.7 |
| 2005/0280495 | A1 | 12/2005 | Douzaka et al. |
| 2006/0044049 | A1 | 3/2006 | Ouellette et al. |
| 2008/0025071 | A1 * | 1/2008 | Anand et al. ............... 365/148 |
| 2008/0157851 | A1 * | 7/2008 | Aipperspach et al. ...... 327/525 |

* cited by examiner

*Primary Examiner*—Tan T. Nguyen
(74) *Attorney, Agent, or Firm*—Cantor Colburn LLP; Joseph Petrokaitis

(57) ABSTRACT

A design structure embodied in a machine readable medium used in a design process includes an apparatus for sensing the state of a programmable resistive memory element device, the apparatus further including a latch device coupled to a fuse node and a reference node, the fuse node included within a fuse leg and the reference node configured within a reference resistance leg, the latch device configured to detect a differential signal developed between the reference node and the fuse node as the result of sense current passed through the fuse leg and the reference resistance leg; and the fuse and reference resistance legs further configured for first and second sensing modes, wherein the second sensing mode utilizes a different level of current than the first sensing mode.

10 Claims, 7 Drawing Sheets

DESIGN STRUCTURE FOR IMPROVING SENSING MARGIN OF ELECTRICALLY PROGRAMMABLE FUSES

CROSS REFERENCE TO RELATED APPLICATIONS

This application is a continuation-in-part of U.S. application Ser. No. 11/460,464, filed Jul. 27, 2006, now U.S. Pat. No. 7,307,911, the contents of which are incorporated herein in their entirety.

BACKGROUND

The present invention relates generally to semiconductor devices and, more particularly, to a design structure for improving sensing margin of electrically programmable fuse type devices in semiconductor devices.

Electrically programmable fuses (eFUSEs) are widely used to implement memory redundancy functionality in dynamic random access memory (DRAM), static random access memory (SRAM) and embedded memory devices. Programmable fuses can also be utilized in applications such as electronic chip identification, product feature personalization, and thermal diode calibration, to name a few.

In a redundancy application, for example, chips returned from fabrication are usually tested and a certain percentage of them are usually found to be bad (e.g., from random contingencies that may occur in the fabrication process). The percentage of good, usable chips is commonly referred to as the "yield." Accordingly, redundancy may enable programming a chip at the testing phase so that flawed portions of the chip are not used in favor of unflawed redundant portions, thereby increasing the yield and decreasing the percentage of chips that must be thrown away as unusable. Many of the applications for electronic fuses combine the electronic fuse with the use of a memory in some way, for example, as part of a memory cell.

Additionally, in electronic chip identification or part number identification, an eFUSE may be used to "program" or write information into a non-volatile memory, which may be comprised of individual memory cells, and the information can then be read from the memory as a unique chip identifier or part number identifier. Furthermore, for thermal diode calibration, a non-volatile memory programmed using electronic fuses can be used to hold a test temperature and the thermal diode voltage read at the test temperature.

Regardless of the specific application environment, an eFUSE is typically programmed by passing a sufficient current through the structure such that its resistance is significantly altered from its initially fabricated state. In order to determine whether a particular fuse has been programmed or not, a sense circuit may be used to detect one of two possible "states" of the fuse. More specifically, the sense circuit holds one of two latched values therein, which is driven by a comparison between an applied voltage (by the sense circuit) across the fuse and a reference voltage generated within the sense circuit. The reference voltage is designed to be between a fuse voltage corresponding to the programmed state and a fuse voltage corresponding to the unprogrammed state.

However, as is typically the case with semiconductor circuit devices, the devices that make up the sense circuit are susceptible to parameter changes (e.g., voltage threshold changes in the case of field effect transistors) during the lifetime of the product in the field. Furthermore, as devices continually move to smaller geometries and lower operating voltages, the structural differences between programmed and unprogrammed fuses become less, thus making it more difficult to sense the state of the fuse. In order to compensate for such variability, sense circuits have been designed using statistical simulations of the expected operating conditions, including power supply voltage, temperature, manufacturing process variations, and fuse resistance. The circuit devices are then adjusted as needed to achieve a sufficient sense margin ($V_{FUSE}-V_{REF}$) so as to tolerate the simulated variability.

Alternatively and/or additionally, fuse resistances are measured at the time of fuse programming (e.g., at wafer final test (WFT)) to assure that sufficient margin exists to successfully sense both intact and programmed fuses during the lifetime of the product. Unfortunately, the time required for implementing comprehensive fuse resistance measurement can be prohibitively long at WFT, particularly in chip designs employing thousands of fuses. It is desirable to enable a different sense margin at WFT with a digital circuit to quickly detect weak fuse cells. Accordingly, there remains a need for improving the sensing margin of electrically programmable fuses in semiconductor devices.

SUMMARY

The foregoing discussed drawbacks and deficiencies of the prior art are overcome or alleviated by a design structure embodied in a machine readable medium used in a design process, the design structure including an apparatus for sensing the state of a programmable resistive memory element device, the apparatus further including a latch device coupled to a fuse node and a reference node, the fuse node included within a fuse leg and the reference node configured within a reference resistance leg, the latch device configured to detect a differential signal developed between the reference node and the fuse node as the result of sense current passed through the fuse leg and the reference resistance leg; and the fuse and reference resistance legs further configured for first and second sensing modes, wherein the second sensing mode utilizes a different level of current than the first sensing mode.

BRIEF DESCRIPTION OF THE DRAWINGS

Referring to the exemplary drawings wherein like elements are numbered alike in the several Figures.

DETAILED DESCRIPTION

Disclosed herein is a design structure for improving sensing margin of electrically programmable fuse type devices in semiconductor devices. Briefly stated, a sensing circuit is configured so as to be able to provide at least two separate modes of fuse sensing in which a different level of current is utilized during the second mode of sensing. Optionally, further test modes with different levels of current may be included. In so doing, a first mode of sensing uses a different level of current such that the trip point resistance range (over simulated device parameter shifts) is changed during device final testing. By applying a higher current with respect to the first mode, a second mode provides more sense margin and ensures sensing operation in field even if the voltage threshold shifts during product lifetime. Accordingly, individual resistance measurements of fuse devices during wafer final testing may be avoided. It should be noted that although the exemplary embodiments described herein are presented in terms of electronic fuse devices, it will be appreciated that the same principles are equally applicable to other current mode sensed memory elements and programmable devices such as, but not limited to, antifuses, EPROMs, mask ROM and flash memory. The following exemplary embodiments apply a higher current in a second mode than that in a first mode for the sensing scheme discussed herein, however it should be appreciated that the opposite can also be implemented (i.e., the second mode applies a lower current than the first mode).

Figure 1:
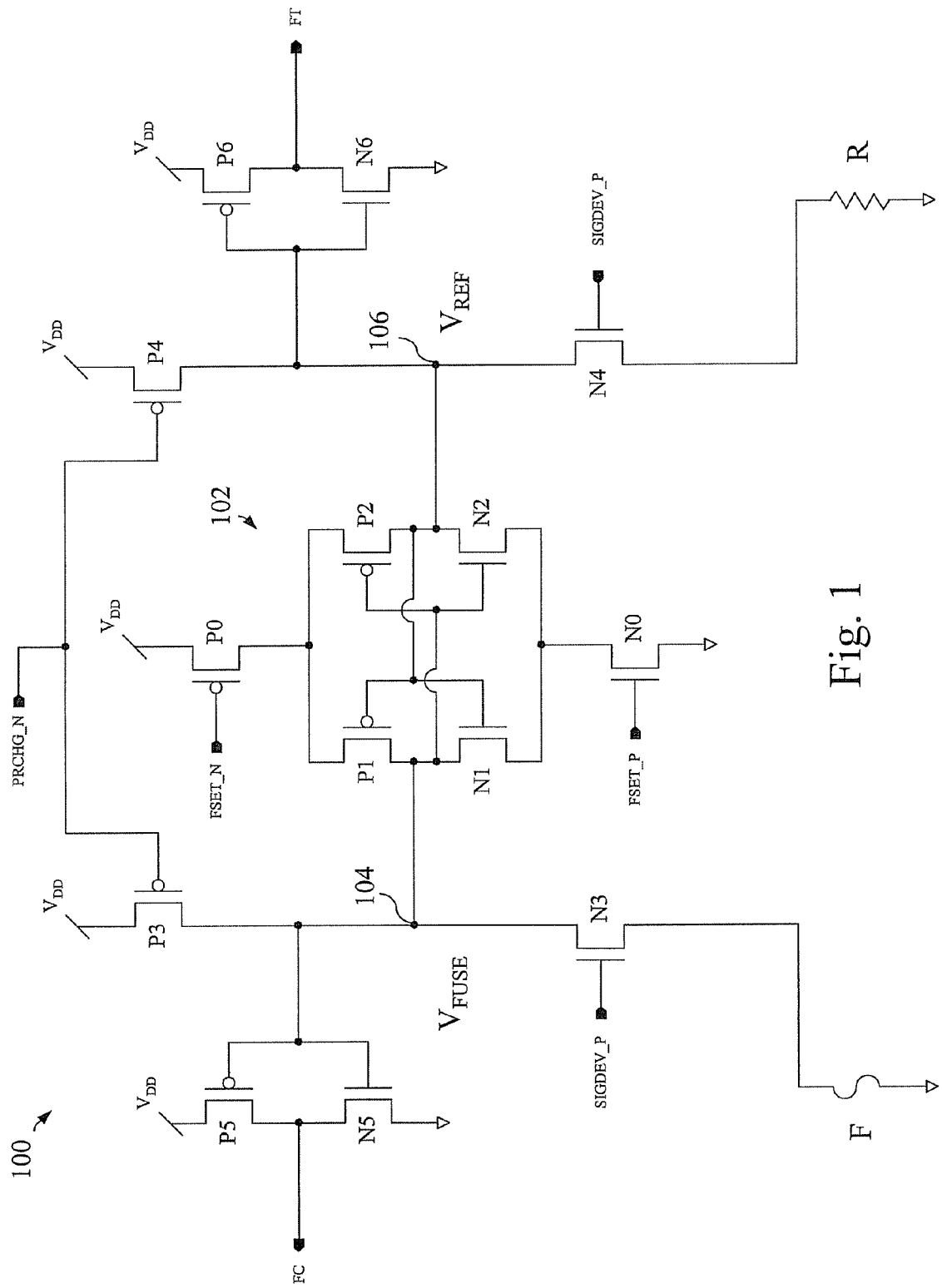
FIG. 1 is a schematic diagram of a differential sense circuit for determining the state of a programmable fuse type device.

Referring initially to FIG. 1, there is shown a schematic diagram of a differential sense circuit 100 suitable for determining the state of a programmable fuse type device, generally designated by "F." As is shown, a CMOS latch 102 (transistors N1, P1, N2 and P2) is coupled to a fuse node 104 and a reference node 106, and is configured to latch a data bit representative of whether the fuse F is in a high resistance state (e.g., programmed) or a low resistance state (e.g., unprogrammed), based on a comparison of the fuse's resistance and the resistance of reference resistance R. PFET P0 and NFET N0, controlled by FSET_N and FSET_P, respectively, are used to selectively couple the latch 102 the power supply rails (e.g., $V_{DD}$ and ground).

In addition, PFETs P3 and P4, located within the fuse and reference resistance legs, respectively, are controlled by signal PRCHG_N and used to precharge the fuse and reference nodes prior to fuse sensing, as well as to supply reference current through fuse F and resistor R during fuse sensing. During the precharge phase, the fuse node 104 isolated from the fuse F through NFET N3, while the reference node 106 is isolated from the reference resistor R through NFET N4. Finally, a pair of output buffers (CMOS) inverters P5/N5 and P6/N6 is included on the fuse and reference nodes to drive the sensed state of the fuse stored in latch 102 to the appropriate output circuitry (not shown).

Prior to sensing of the state of the fuse F, the power supply connections to the latch 102 are disengaged; i.e., PFET P0 and NFET N0 are in a nonconducting state. Control signal PRCHG_N is active (low) to activate P3 and P4 and precharge the fuse and reference nodes to $V_{DD}$. Control signal SIGDEV_P is initially low, but then goes active high to couple the fuse F to the fuse node 104 and to couple the reference resistor R to the reference node 106. Depending upon whether the fuse F is in a high resistance state or a low resistance state, the amount of current through the fuse path will be either lower or higher than the amount of current through the reference path. Consequently, the voltage of the fuse node 104 ($V_{FUSE}$) will be lower or higher than the voltage of the reference node ($V_{REF}$).

However, as indicated above, the simulated variability of the various sense circuit parameters demonstrates a shift in the resistance trip point range over the lifetime of the device. Because the sense circuit of FIG. 1 is only capable of fuse state sensing using a single nominal level of test current (i.e., has a single test mode), the prospect of sensing the correct state of a fuse during the product's lifetime becomes less certain, particularly where the trip point resistance increases with increased negative bias thermal instability (NBTI) of PFET devices, for example.

Figure 2A:
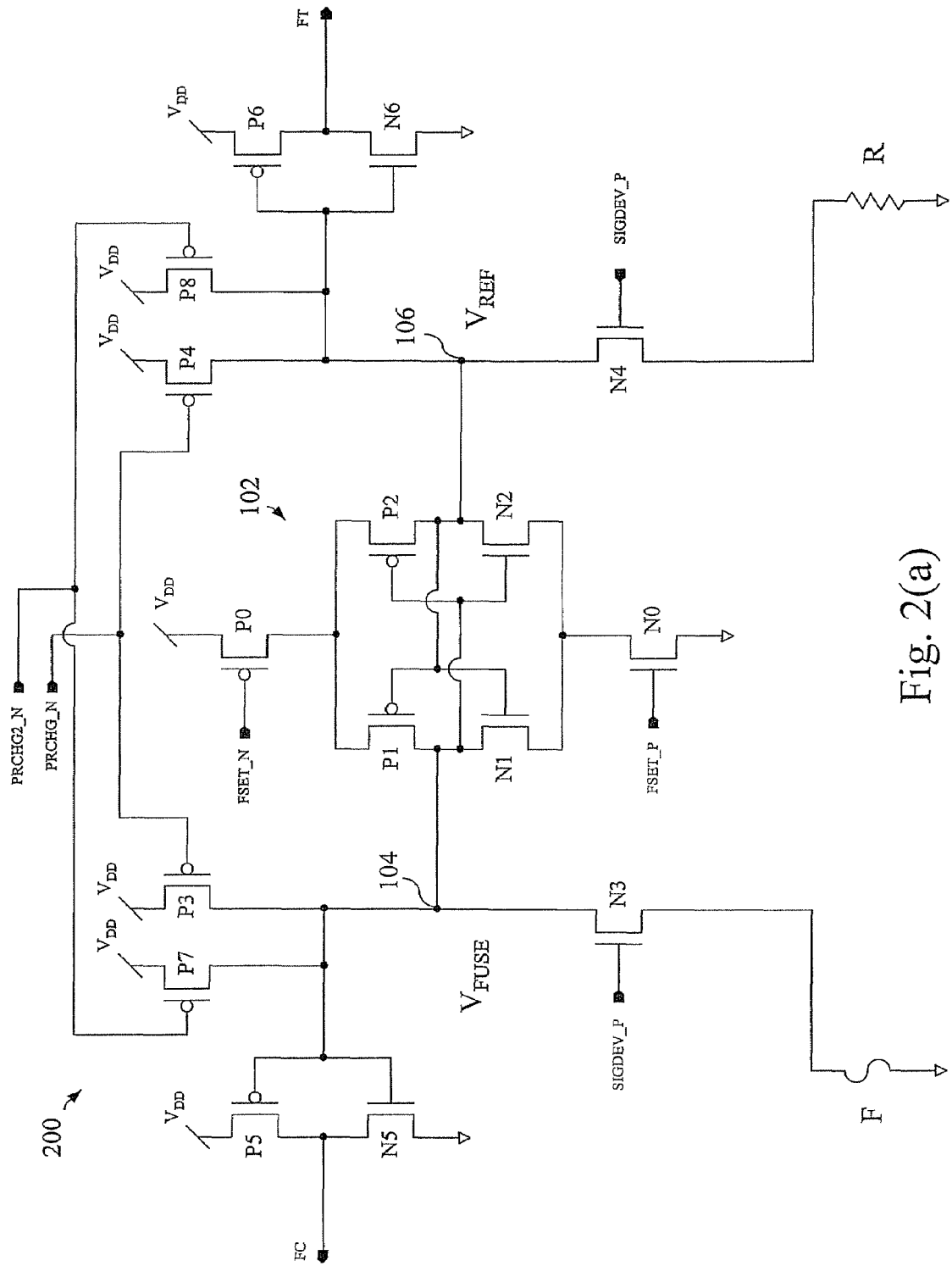
FIG. 2(a) is a schematic diagram of a differential sense circuit for determining the state of a programmable fuse type device, adapted for increased sense margin, in accordance with an embodiment of the invention.

Therefore, in accordance with an embodiment of the invention, FIG. 2(a) is a schematic diagram of a differential sense circuit 200 for determining the state of a programmable fuse type device, adapted for increased sense margin. The device shown therein depicts an exemplary modification that allows the sense circuit 200 to implement a second mode of fuse sensing, wherein a larger level of current is used with respect to a first mode of fuse sensing. In so doing, the effective trip point range of the sense circuits are at a lower resistance value with respect to the first mode, thereby facilitating successful fuse state sensing throughout the life of the product. In the embodiment shown, sense circuit 200 is provided with an additional pair of PFETs, P7 and P8 in parallel with fuse leg PFET P3 and resistance leg PFET P4, respectively. The additional PFETs P7, P8 are controlled by a separate control signal PRECHG2_N, which is activated in the second mode of sensing. Because the additional PFETs provide an extra source of current through each differential leg, the overall trip resistance of the sense circuit 200 is lower in the second mode of operation. Exemplary timing diagrams comparing the first and second modes of operation are discussed hereinafter.

Figure 2B:
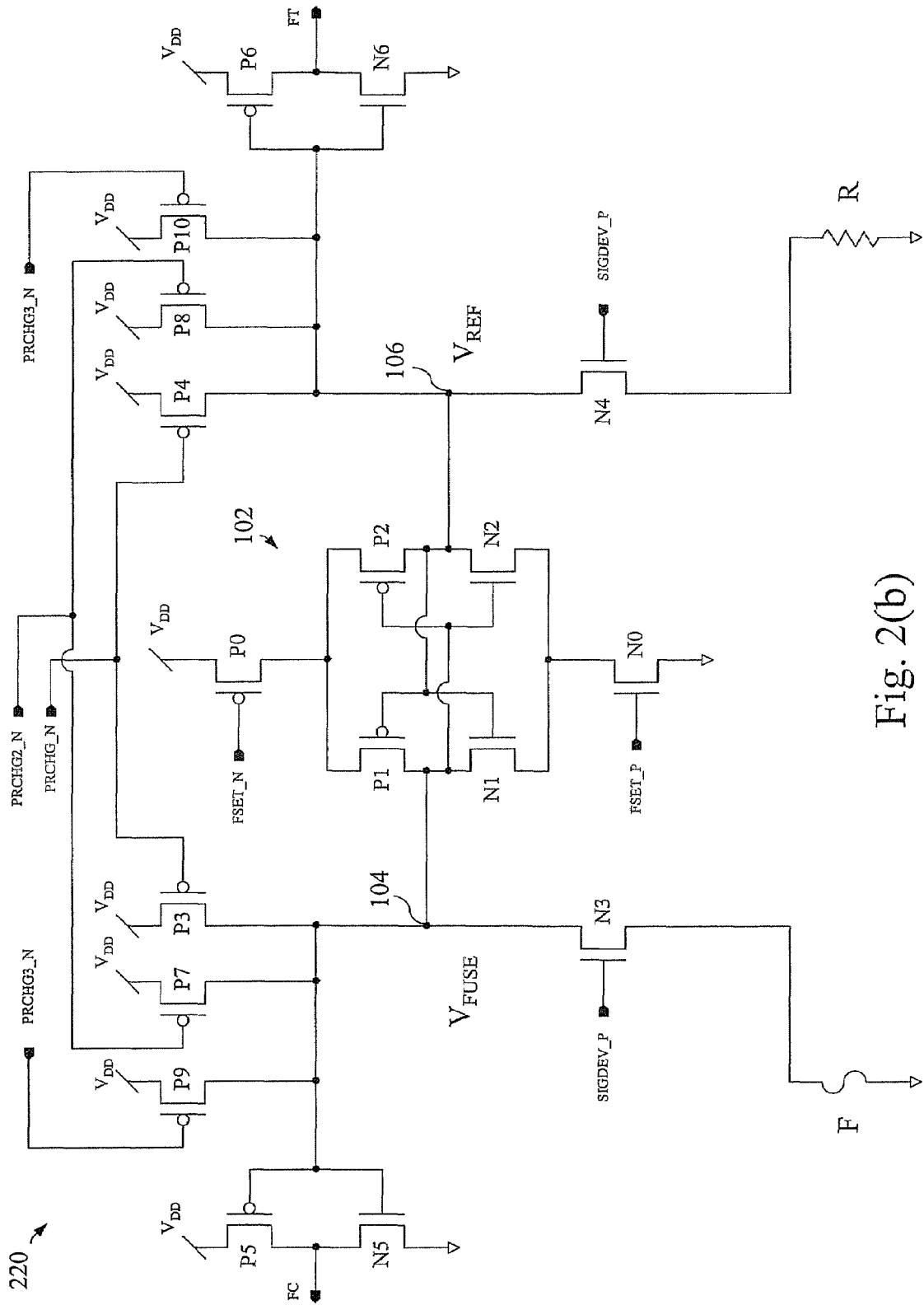
FIG. 2(b) is a schematic diagram of a differential sense circuit for determining the state of a programmable fuse type device, adapted for increased sense margin, in accordance with an alternative embodiment of the invention.

FIG. 2(b) illustrates an alternative embodiment of a differential sense circuit 220 for determining the state of a programmable fuse type device. In this embodiment, another pair of parallel PFETs P9, P10 are added and controlled by a third control signal PRECHG3_N, which is also activated in an optional third mode of sensing. A third mode of sensing may be desirable, for example, to enable the determination of a different sense margin to detect a weak fuse element. Still additional PFET devices can be included for even more modes of sensing, wherein each mode provides a different level of test current than the other modes. Alternatively, a third mode of sensing could also be implemented using the circuit embodiment of FIG. 2(a), by activating PFETs P7 and P8 without activating P3 and P4. In this instance, the device strength of P7 is different from that of P3, and the device strength of P8 is different from that of P4. It will thus be appreciated that even further modes of sensing are possible by providing additional (but distinct) levels of current during fuse testing.

Figure 3:
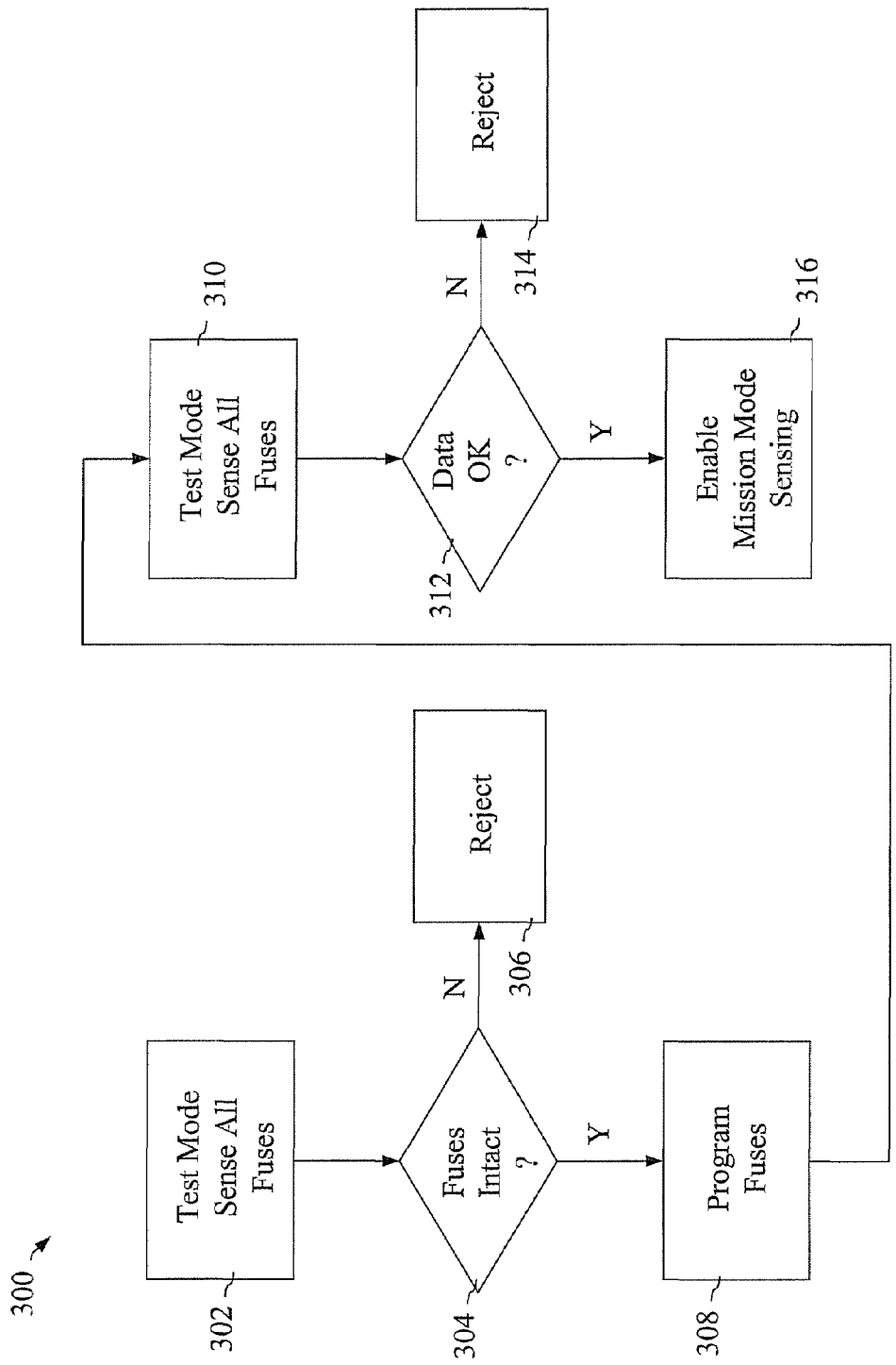
FIG. 3 is a process flow diagram illustrating a method for testing electronic fuse type devices, with increased sensing margin used after testing during product lifetime, in accordance with a further embodiment of the invention.

FIG. 3 is a flow diagram illustrating a method for testing electronic fuse type devices with nominal sense margin prior to operation in the field with increased sensing margin, in accordance with a further embodiment of the invention. As initially indicated in block 302, the state of each fuse of a device is tested (prior to fuse programming) during wafer final testing. In this instance, the first mode (lower current) is used for such testing in order to determine that the fuses are intact. For purposes of description, the "first mode" of testing at lower current is used synonymously with the term "test mode." Because the fuses are not programmed at this point, it is expected that each fuse should have the unprogrammed low resistance. If the fuses are not intact, as determined at decision block, 304, then the wafer (or chip within the wafer) is rejected at this point. Assuming, however, that the fuses are intact, they are then programmed in accordance with the device particulars, as shown at block 308.

Once again, the "test mode" of the applicable sense circuitry is used to determine the state of the programmed fuses, as shown in block 310. If the sensed data does not match the intended programmed data, as determined at decision block 312, then the device is rejected as shown at block 314. However, if the sensed fuse states using the test mode are correct, then "mission" (second) mode sensing is enabled thereafter for use during the product lifetime, as shown in block 316. This may be carried out in a number of ways such as, for example, preventing the test mode (lower current) from being used again following completion of final testing, providing the customer instructions to wire the device for mission mode (higher current) sensing, or by programming another fuse to force mission mode sensing. Other enablement techniques, however, are also possible.

Figure 4:
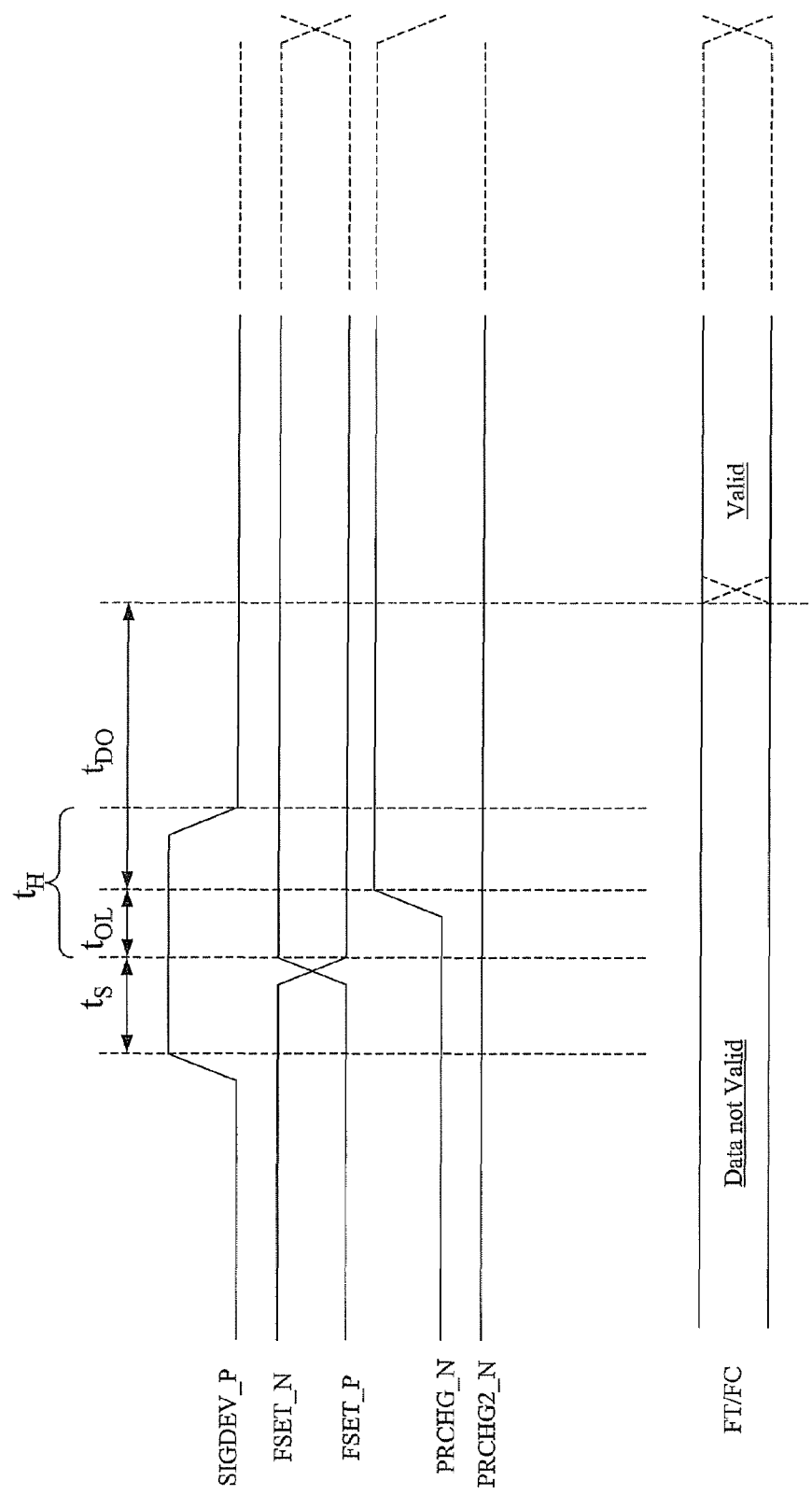
FIG. 4 is a timing diagram illustrating the operation of the sense circuit of FIG. 2 and the flow diagram of FIG. 3 in a first mode of testing during product fabrication.
Figure 5:
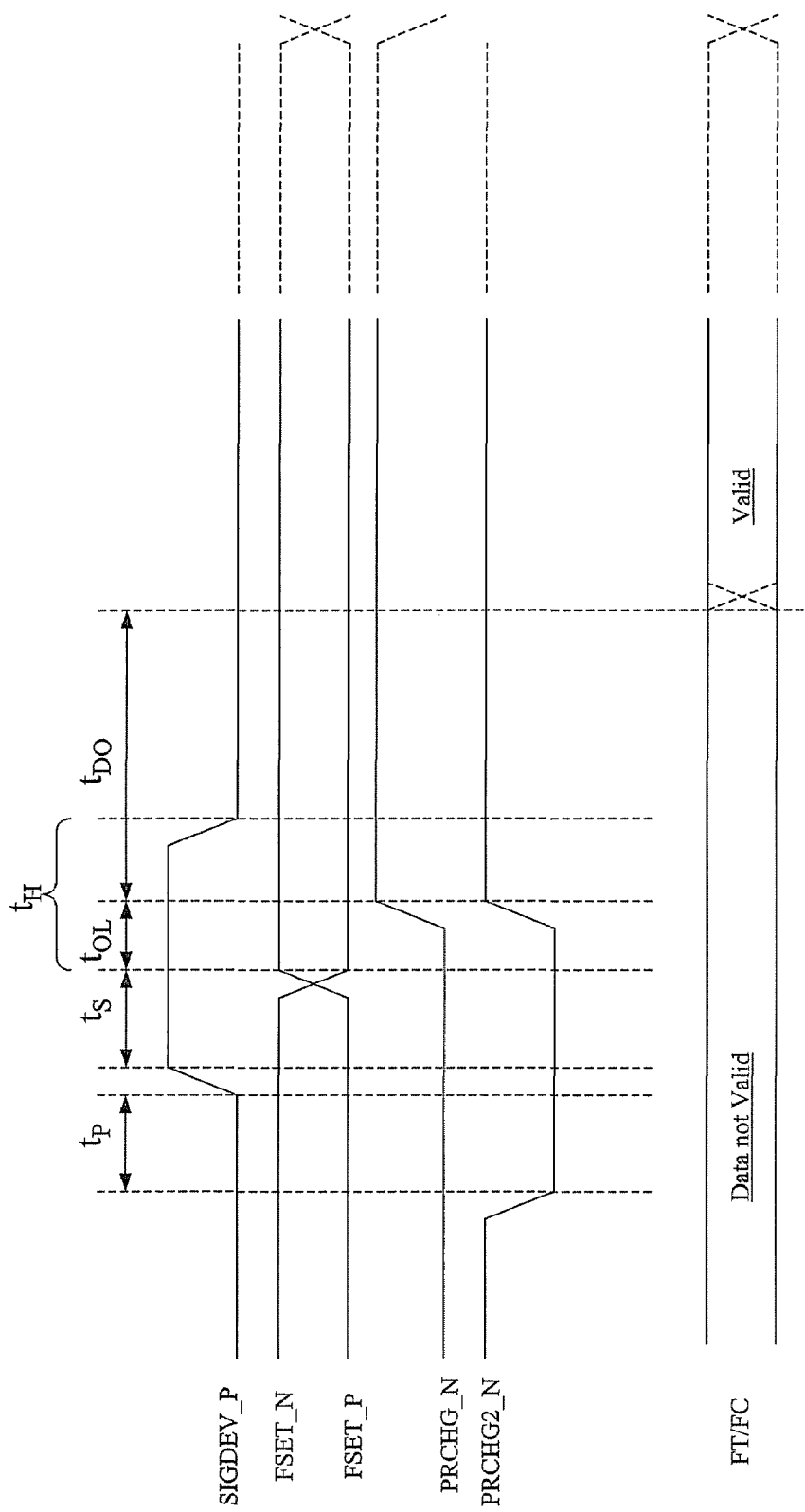
FIG. 5 is a timing diagram illustrating the operation of the sense circuit of FIG. 2 and the flow diagram of FIG. 3 in a second mode during product lifetime.

FIGS. 4 and 5 are timing diagrams illustrating the operation of the sense circuit 200 of FIG. 2 and the flow diagram of FIG. 3 in the first (test) and second (mission) modes of operation, respectively. Beginning with FIG. 4, it will be seen that prior to fuse sensing, control signal SIDDEV_P is low, therefore isolating the fuse F and reference resistor R. The power connections P0, N0, to the latch 102 are also disabled through control signals FSET_N and FSET_P prior to sensing in the test mode. However, in this precharge phase of the test mode, it will further be seen that control signal PRECHG_N is active to hold nodes 104 and 106 at the supply rail voltage, $V_{DD}$. As the circuit 200 of FIG. 2 also has the second "mission" mode capability, which is not utilized during wafer final test, the control signal PRCHG2_N is constantly maintained at a deactivated high state to keep PFETs P7 and P8 off.

Continuing with FIG. 4, during a signal develop portion ($t_S$) of the test mode sense cycle, control signal SIGDEV_P has activated by transitioning from low to high. This couples the fuse F and reference resistor R to the precharged nodes 104, 106, respectively, thereby causing current to flow through each leg. Depending on the state of the fuse, the current flowing through the fuse leg of the differential sense circuit 200 should either be less than or greater than the current flowing through the reference leg. As a result, a differential voltage will be developed between $V_{FUSE}$ and $V_{REF}$ (nodes 104 and 106). Then, power to the latch 102 is provided as indicated by the activation of control signals FSET_N and FSET_P at the end of the signal develop portion ($t_S$) of the test mode cycle.

The next portion of the test mode cycle is depicted in FIG. 4 as a "hold" portion ($t_H$), in which the differential signal developed across the fuse and reference nodes in latched into the latch 102. Optionally, an overlap portion ($t_{OL}$) maintains the PRECHG_N signal activated during the initial stage of the hold portion ($t_H$). Shortly thereafter, PRECHG_N is deactivated, allowing the latch 102 to fully drive $V_{FUSE}$ and $V_{REF}$ to the complementary logical values, again depending on the state of the fuse F. As this latched fuse state is realized, the data on the nodes begins to drive output buffers P5/N5 and P6/N6. In addition, control signal SIGDEV_P is deactivated to decouple the fuse F and reference resistor R from the latch 102. A final portion of the sensing stage prior to the sensed data being outputted and deemed valid is depicted as $t_{DO}$ in FIG. 4.

In comparison, FIG. 5 illustrates the operation of the second "mission" mode of sensing during product lifetime. As can be seen, the operation is similar to the first "test" mode of sensing, except that the control PRCHG2_N (unlike PRECHG_N) is not active low the entire time during the precharge phase of the sense operation, but is instead activated for a brief time ($t_P$) just prior to the SIGDEV_P being activated. This prevents the parallel PFETs P7 and P8 from unnecessary degradation during product lifetime. However, P7 and P8 are preferably activated a sufficient time prior to coupling the fuse and reference resistor to the sensing nodes. Moreover, during this enhanced mode of current sensing, it is seen from FIG. 5 that PRCHG_N and PRCHG2_N are simultaneously deactivated after initial signal development.

Figure 6:
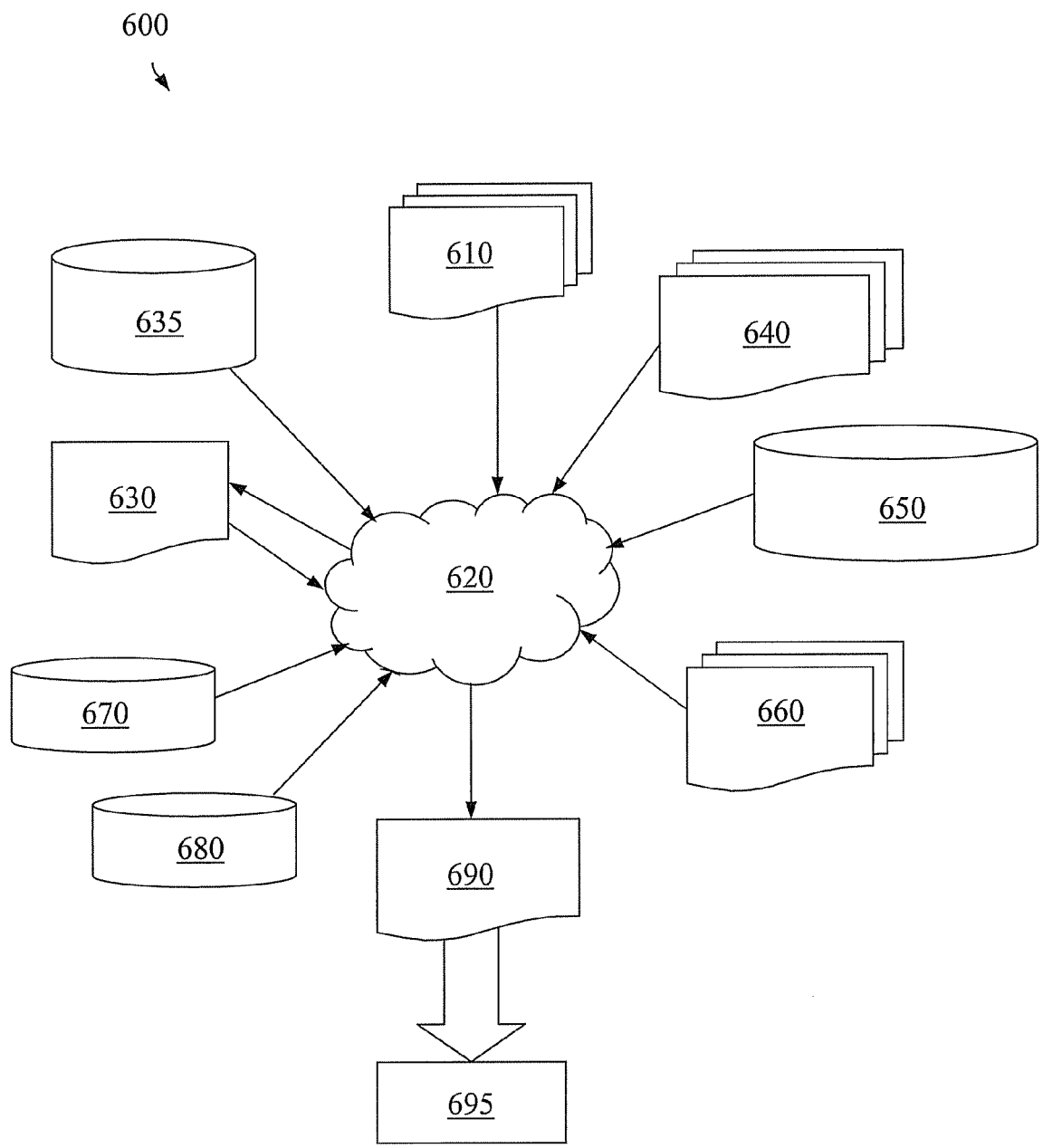
FIG. 6 is a flow diagram of an exemplary design process used in semiconductor design, manufacturing, and/or test.

FIG. 6 is a block diagram illustrating an example of a design flow 600. Design flow 600 may vary depending on the type of IC being designed. For example, a design flow 600 for building an application specific IC (ASIC) will differ from a design flow 600 for designing a standard component. Design structure 610 is preferably an input to a design process 620 and may come from an IP provider, a core developer, or other design company or may be generated by the operator of the design flow, or from other sources. Design structure 610 comprises circuit embodiments 200, 220 in the form of schematics or HDL, a hardware-description language, (e.g., Verilog, VHDL, C, etc.). Design structure 610 may be contained on one or more machine readable medium(s). For example, design structure 610 may be a text file or a graphical representation of circuit embodiments 200, 220. Design process 620 synthesizes (or translates) circuit embodiments 200, 220 into a netlist 630, where netlist 630 is, for example, a list of wires, transistors, logic gates, control circuits, I/O, models, etc., and describes the connections to other elements and circuits in an integrated circuit design and recorded on at least one of machine readable medium 615. This may be an iterative process in which netlist 630 is resynthesized one or more times depending on design specifications and parameters for the circuit.

Design process 620 includes using a variety of inputs; for example, inputs from library elements 635 which may house a set of commonly used elements, circuits, and devices, including models, layouts, and symbolic representations, for a given manufacturing technology (e.g., different technology nodes, 32 nm, 45 nm, 90 nm, etc.), design specifications 640, characterization data 650, verification data 660, design rules 670, and test data files 680, which may include test patterns and other testing information. Design process 620 further includes, for example, standard circuit design processes such as timing analysis, verification tools, design rule checkers, place and route tools, etc. One of ordinary skill in the art of integrated circuit design can appreciate the extent of possible electronic design automation tools and applications used in design process 620 without deviating from the scope and spirit of the invention. The design structure of the invention embodiments is not limited to any specific design flow.

Design process 610 preferably translates embodiments of the invention as shown in FIGS. 2(a) and 2(b), along with any additional integrated circuit design or data (if applicable), into a second design structure 690. Second design structure 690 resides on a storage medium in a data format used for the exchange of layout data of integrated circuits (e.g. information stored in a GDSII (GDS2), GL1, OASIS, or any other suitable format for storing such design structures). Second design structure 690 may comprise information such as, for example, test data files, design content files, manufacturing data, layout parameters, wires, levels of metal, vias, shapes, data for routing through the manufacturing line, and any other data required by a semiconductor manufacturer to produce embodiments of the invention as shown in FIGS. 2(a) and 2(b). Second design structure 690 may then proceed to a stage 695 where, for example, second design structure 690: proceeds to tape-out, is released to manufacturing, is released to a mask house, is sent to another design house, is sent back to the customer, etc.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A design structure embodied in a machine readable medium used in a design process, the design structure comprising:
   an apparatus for sensing the state of a programmable resistive memory element device, the apparatus further comprising a latch device coupled to a fuse node and a reference node, the fuse node included within a fuse leg and the reference node configured within a reference resistance leg, the latch device configured to detect a differential signal developed between the reference node and the fuse node as the result of sense current passed through the fuse leg and the reference resistance leg; and
   the fuse and reference resistance legs further configured for first and second sensing modes, wherein the second sensing mode utilizes a different level of current than the first sensing mode.

2. The design structure of claim 1, further comprising:
   a first pair of switching devices, one of which is configured within the fuse leg and the other of which is configured within the reference resistance leg, the first pair of switching devices configured to deliver a first level of current associated with the first sensing mode; and
   a second pair of switching devices, in parallel with the first pair of switching devices, the second pair of switching devices configured to deliver a second level of current associated with the second sensing mode.

3. The design structure of claim 2, wherein the first pair of switching devices comprises a first pair of PFET devices further configured to precharge the fuse node and the reference node prior to sensing the state of the programmable fuse device, and the second pair of switching devices comprises a second pair of PFET devices configured to operate in conjunction with the first pair of PFET devices in order to increase the sense current used in the second sensing mode.

4. The design structure of claim 3, further comprising a pair of output buffers, one of which is coupled to the fuse node and the other of which is coupled to the reference node, the pair of output buffers configured to drive the state of the latch device.

5. The design structure of claim 1, wherein the programmable resistive memory element device comprises one of: a fuse device, an antifuse device, an EPROM device, a mask ROM device and a flash memory device.

6. The design structure of claim 1, wherein the fuse and reference resistance legs are further configured for a third sensing mode, wherein the third sensing mode utilizes a different level of current than the first and second sensing mode.

7. The design structure of claim 6, further comprising:
   a first pair of switching devices, one of which is configured within the fuse leg and the other of which is configured within the reference resistance leg, the first pair of switching devices configured to deliver a first level of current associated with the first sensing mode;
   a second pair of switching devices, in parallel with the first pair of switching devices, the second pair of switching devices configured to deliver a second level of current associated with the second sensing mode; and
   a third pair of switching devices, in parallel with the first and second pairs of switching devices, the third pair of switching devices configured to deliver a third level of current associated with the third sensing mode, the third level different from both the first and second levels of current.

8. The design structure of claim 1, wherein the design structure comprises a netlist describing the apparatus for sensing the state of the programmable resistive memory element device.

9. The design structure of claim 1, wherein the design structure resides on storage medium as a data format used for the exchange of layout data of integrated circuits.

10. The design structure of claim 1, wherein the design structure includes at least one of test data files, characterization data, verification data, programming data, or design specifications.

* * * * *